(12) United States Patent
Uemura et al.

(10) Patent No.: US 8,673,070 B2
(45) Date of Patent: Mar. 18, 2014

(54) PROCESS FOR PRODUCING SILICON OXIDE THIN FILM OR SILICON OXYNITRIDE COMPOUND THIN FILM AND THIN FILM OBTAINED BY THE PROCESS

(75) Inventors: Sei Uemura, Tsukuba (JP); Toshihide Kamata, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 371 days.

(21) Appl. No.: 13/061,495

(22) PCT Filed: Aug. 28, 2009

(86) PCT No.: PCT/JP2009/065046
§ 371 (c)(1),
(2), (4) Date: Feb. 28, 2011

(87) PCT Pub. No.: WO2010/024378
PCT Pub. Date: Mar. 4, 2010

(65) Prior Publication Data
US 2011/0185948 A1 Aug. 4, 2011

(30) Foreign Application Priority Data
Aug. 29, 2008 (JP) ................... 2008-220947

(51) Int. Cl.
C04B 24/00 (2006.01)
C04B 14/00 (2006.01)
C08F 2/48 (2006.01)

(52) U.S. Cl.
USPC .......................... 106/632; 427/508

(58) Field of Classification Search
USPC ..................... 106/481, 316, 632; 427/508
See application file for complete search history.

(56) References Cited

FOREIGN PATENT DOCUMENTS

| JP | H07187656 | 1/1997 | |
|---|---|---|---|
| JP | H10090828 | 4/1998 | |
| JP | H11329719 | 5/2001 | |
| JP | 2003041153 | 2/2003 | |
| JP | 2003187959 | 7/2003 | |
| JP | 2004179542 | 6/2004 | |
| JP | 2005166400 | 6/2005 | |
| JP | 2005302469 | 10/2005 | |
| JP | 2007022075 | * 2/2007 | ............... B32B 9/04 |
| JP | 2008159824 | 7/2008 | |

OTHER PUBLICATIONS

"Silicon oxide composite film fabricated by wet-process at low temperature as a passivation layer for printable electric device" to Uemura et al. materi. Res Soc Symp.Proc. vol. 1113 available Dec. 2008.*

* cited by examiner

*Primary Examiner* — Shuangyi Abu Ali
(74) *Attorney, Agent, or Firm* — Workman Nydegger (57) ABSTRACT

Disclosed is a process for producing a silicon oxide or silicon oxynitride thin film having a high level of water vapor and oxygen barrier property and a high strength with a higher efficiency by a solution process which is advantageous in productivity. Also disclosed is a thin film that is obtained by the process and is useful, for example, as a protective film for electric elements such as organic EL elements. A solution containing a smectite group silicate layered compound and a silazane compound is coated onto a surface of a substrate by a liquid phase process to form a film. The thin film thus obtained is exposed to ultraviolet light under an oxygen atmosphere to produce a silicon oxide thin film or a silicon oxynitride compound thin film containing the smectite group silicate layered compound. The smectite group silicate compound is a material represented by the following general formula.

$$A_{1/3}B_m Si_4 O_{10} \cdot n H_2 O$$ [Chemical Formula 1]

4 Claims, 7 Drawing Sheets

POLYSILAZANE ONLY

CLAY : POLYSILAZANE = 2:8

CLAY : POLYSILAZANE = 4:6

FIG.3

CLAY : POLYSILAZANE = 6:4

CLAY : POLYSILAZANE = 8:2

CLAY ONLY

PROCESS FOR PRODUCING SILICON OXIDE THIN FILM OR SILICON OXYNITRIDE COMPOUND THIN FILM AND THIN FILM OBTAINED BY THE PROCESS

TECHNICAL FIELD

The present invention relates to a method of manufacturing a silicon oxide thin film or a silicon oxynitride thin film containing a smectite silicate by a solution process and to a thin film obtained by the process.

BACKGROUND ART

Through the adaptation of solution process such as printing method and ink-jet method to electronic devices, the application thereof to ultra-thin large displays, portable flexible displays, ID tags, or the like has been expected because of no need of using high vacuum process, high temperature process, or photolithographical process in manufacturing the devices; high adaptability to flexible substrates such as plastics; and high productivity.

For the development of electronic devices exerting the above performance, there have been required materials for constituting devices, which is formed by coating of a solution such as a printing process or the like, and has flexibility and high impact resistance.

Among display devices, organic EL devices have been the most promising devices in applying to plastic substrates, since they exhibit excellent image-quality performance and they are easy in terms of fabricating ultrathin devices.

Although there have been developed varieties of materials for emitting layer and for charge transport satisfying the above requirements at the present time, they are having a problem of being sensitive to surrounding environment of oxygen, water, and the like.

Consequently, there has been required to provide the organic EL device having a protective film thereon, in order to increase the environmental resistance. However, although a protective film is required to be manufactured also by means of the coating process when an organic EL device is formed on a flexible substrate by means of a coating process, a material in which the flexibility is expected is difficult to be obtained. Further, there arises a problem that the protective film manufactured by the manufacturing method using the solution process does not fully perform the functions.

As a typical example of the protective film for organic EL device, there is a method in which a thin film of silicon nitride or silicon dioxide is formed on an organic EL device by a CVD method and the like (refer to Patent Literature 1).

Furthermore, for increasing the adaptability to the device on a flexible substrate, there are proposed techniques of alternate lamination of inorganic materials and organic materials to relax the stress of the protective film in the device, or the like, as the protective film having increased resistance to flexural stress (refer to Patent Literature 2).

Moreover, as a technology of increasing specifically the resistance to moisture permeation among the functions of a protective film, there is a report or the like of dispersing phosphorus pentaoxide, silica gel, and the like as the water absorbent in the protective layer (refer to Patent Literature 3).

In all of the above-described exemplary developed techniques, the protective film of inorganic material which assures high barrier properties is formed by a vacuum process, and the film cannot satisfy the barrier properties required by organic EL devices.

Therefore, since all of the structural components of an organic EL device have been difficult to be manufactured by a solution process, the vacuum process has to be accommodated in the forming step, which raises a problem of being unable to exert the advantage of productivity inherent to the solution process.

Meanwhile, the fields of food-products, medical treatments, construction materials, and photography, the development of thick films having high gas-barrier and water vapor-barrier properties has been intensively progressing, and realization of high barrier properties has been attempted by adding a smectite silicate compound to a polymer material (refer to Patent Literature 4, and the like).

In this case, the addition of smectite silicate compound has been often performed to polymers, and the improvement in barrier properties by the addition of smectite silicate can be confirmed. However, the effect is far smaller compared with the level required by organic EL devices, by about five digits in terms of water vapor permeability, since the barrier properties of polymer are significantly poor, (refer to Patent Literature 5).

Furthermore, there is also another example in which mica is dispersed in a metal oxide glass by means of a sol-gel method. However, because of the characteristics of the manufacturing method, a dense film cannot be obtained, and thus high barrier properties cannot be attained (refer to Patent Literature 6, and the like).

CITATION LIST

Patent Literature

PTL 1: Japanese Patent Laid-Open No. 2005-166400
PTL 2: Japanese Patent Laid-Open No. 2003-187959
PTL 3: Japanese Patent Laid-Open No. H11-329719 (1999)
PTL 4: Japanese Patent Laid-Open No. H10-090828 (1998)
PTL 5: Japanese Patent Laid-Open No. 2003-041153
PTL 6: Japanese Patent Laid-Open No. 2005-166400

SUMMARY OF INVENTION

Technical Problem

An object of the present invention is to provide a method of manufacturing effectively a silicon oxide thin film or a silicon oxynitride thin film having high barrier properties against water vapor and oxygen and high impact strength by a solution process which has advantageous productivity, and to provide a thin film obtained by the method and useful as, for example, a protective film of electronic elements of organic EL devices, and the like.

Solution to Problem

As a result of intensive study to solve the above-described problem, the present inventors have found that a thin film containing silicon oxide or silicon oxynitride compound is obtained efficiently by irradiating a silazane coated film containing a smectite-family silicate laminar compound with the ultraviolet radiation in an oxygen atmosphere, that the thin film thus obtained exhibits high barrier properties against water vapor and oxygen and exhibits high strength, and that the thin film is extremely useful as, for example, a protective film of electronic elements of organic EL devices, thus having perfected the present invention.

According to the present patent application, the following inventions are provided.

(1) A silicon oxide thin film or a silicon oxynitride compound thin film, wherein a smectite-family silicate laminar compound in a weight ratio of 50% or less forms a laminar structure in which the smectite-family silicate laminar compound is oriented substantially parallel to a surface of the thin film.

(2) The thin film according to claim 1, wherein the smectite-family silicate compound is a material represented by the general formula of:

$$A_{1/3}B_mSi_4O_{10}(OH)_2 \cdot nH_2O$$ [Chemical formula 1]

wherein A represents sodium, calcium, or lithium, which exists solely or as a mixture of them; B represents a metal selected from aluminum, magnesium, lithium, iron, zinc, copper, nickel or chromium, or a mixture of two of them; Si represents silicon or a mixture of silicon and aluminum; OH represents hydroxyl group; m is 2 or 3; and n is an arbitrary positive rational number.

(3) A method of manufacturing the thin film according to claim 1 or 2, comprising the steps of: coating a solution of silazane compounds containing the smectite-family silicate compound onto a surface of a substrate to form a coated film thereon; and irradiating the coated film with the ultraviolet radiation in an oxygen atmosphere.

Advantageous Effects of Invention

According to the manufacturing method of the present invention, a silicon oxide thin film or a silicon oxynitride thin film having high barrier properties against water vapor and oxygen and having high strength can be efficiently manufactured by a solution process having advantageous productivity.

Since the silicon oxide thin film or the silicon oxynitride thin film containing a smectite-family silicate compound, obtained by the above method, has excellent gas-barrier properties against oxygen and the like, resistance to moisture permeation, and further impact resistance, the thin film can be used as a protective film of electronic devices including organic EL devices, thus increasing the durability of the devices. Furthermore, the thin film can be coated on a plastic substrate. Because of the high impact resistance, the thin film can be used in wide fields, and is highly expected as a technology of advancing film-state devices, large area devices, and flexible devices.

| Reference Signs List | |
| --- | --- |
| 10 | Substrate |
| 20 | Electronic element |
| 30 | Silicon oxide thin film |
| 40 | Smectite-family silicate laminar compound |

DESCRIPTION OF EMBODIMENTS

The method of manufacturing a silicon oxide thin film or a silicon oxynitride compound thin film containing smectite-family silicate laminar compound according to the present invention is characterized by coating a solution containing a smectite-family silicate laminar compound and a silazane onto a surface of a substrate, and photo-irradiating the coated film with an ultraviolet radiation in an oxygen atmosphere.

The coated film containing the silazane compound generates ammonia and oxygen by photo-irradiating it with the ultraviolet radiation in an oxygen atmosphere or a nitrogen-containing oxygen atmosphere, and is converted to a silicon oxide thin film or a silicon oxynitride thin film. Furthermore, a silicon oxynitride thin film can be obtained by irradiating the similar thin film with the ultraviolet light in an oxygen-free nitrogen atmosphere or under a vacuum.

Therefore, the method of the present invention makes it possible to form a protective film of an organic EL device, for example, by means of a coating process while the organic EL device is formed on a flexible substrate by means of a coating process. In addition, such formed protective film is an inorganic film having high barrier properties against water vapor and oxygen and a high strength. As a result, all of the above-described problems of the conventional organic EL devices can be solved, since the function of the protective film is fully exerted.

The substrate used in the present invention is not particularly limited, and any material can be used as the substrate. The substrate generally and preferably used is a glass substrate such as quartz, or the like. In addition, plastic film substrates such as polycarbonate (PC), polyimide (PI), polyethylene naphthalate (PEN), polyethylene terephthalate (PET), polyethersulfone (PES), polyacrylate (PAR), or polyetherketone (PEEK), ceramic films such as green sheets, and metallic foil films, flexible film substrates, or the like can be used. It is preferable that the film substrate is coated by a protective film such as a silicon nitride thin film or a silicon oxynitride thin film formed by, for example, CVD or sputtering, in order to increase gas barrier properties and resistance against water vapor permeation.

Silazane compounds are used as the raw material of the present invention. These silazane compounds are compounds mainly constituted of silicon atoms, nitrogen atoms, and hydrogen atoms. Any compound which is soluble in the solvent used can be used. As such silazane compounds, there can be used, for example, commercially available polysilazane type NN110, NN310, NL110, NL120, NL150, NP110, NP140, SP140, UP140 (manufactured by AZ ELECTRONIC MATERIAL) and the like.

Furthermore, other elements such as oxygen atoms and carbon atoms may be included as long as they are soluble in the solvent used. As such silane compounds, there can also be used commercially available alkylsiloxane type HOSP, ACCUGLASS, ACCUFLO (manufactured by HONEYWELL), HSG (manufactured by HITACHI CHEMICAL Co., Ltd.), OCDT-9, OCLT (manufactured by Hitachi Chemical Co., Ltd.), LKD-T200, LKD-T400 (manufactured by JSR CORPORATION), ALCAP-S (manufactured by Asahi Kasei Corporation), silica aerogel (manufactured by KOBE STEEL, Ltd.), polyELK (manufactured by Air Products and Chemicals, Inc.), and the like.

According to the present invention, a thin film is manufactured from a solution containing these raw materials of silazane compound (hereinafter referred to also as a matrix) and smectite-family silicate compound by means of a solution process. Then, the thin film can be converted into a silicon oxide thin film or a silicon oxynitride compound thin film containing the smectite-family silicate compound by irradiating the thin film with the ultraviolet radiation in an oxygen atmosphere or the like, preferably along with heating.

Examples of the silicon oxide thin film or silicon oxynitride compound thin film include solid films constituted of all the elements or a part of the elements of silicon atoms, oxygen atoms, hydrogen atoms, and nitrogen atoms in, for example, oxides such as $SiO_2$, oxynitride such as $SiON$, or the like.

Furthermore, the above-described thin films obtained by the method of the present invention have a structure in which the plate-like smectite silicate compounds are arranged in parallel to the surface of the film.

Aromatic hydrocarbons, aliphatic hydrocarbons, alicyclic hydrocarbons, halogenated hydrocarbons, halogenated aromatic hydrocarbons, ethers, amines, and the like can be used as solvents used in the present invention. Generally and preferably used are benzene, toluene, xylene, ethylbenzene, cyclohexane, methylcyclohexane, pentane, hexane, heptane, octane, nonane, decane, diethyl ether, dipropyl ether, dibutyl ether, methylethyl ketone, methylisobutyl ketone, tetrahydrofuran, chloroform, methyl chloride, pyridine, and the like. Besides, purified solvents from which impurities such as water and a trace of inorganic components are highly removed are desirable.

A smectite-family laminar silicate compound used in the present invention is constituted by a compound represented by the general formula of:

[Chemical formula 1]

$$A_{1/3}B_mSi_4O_{10}(OH)_2 \cdot nH_2O$$

wherein A represents sodium, calcium, or lithium, which exists solely or as a mixture of them; B represents a metal selected from aluminum, magnesium, lithium, iron, zinc, copper, nickel or chromium, or a mixture of two of them; Si represents silicon or a mixture of silicon and aluminum; OH represents hydroxyl group; m is 2 or 3; and n is an arbitrary positive rational number.

Hectrite, montmorillonite, bidellite, nontronite, saponite, sauconite, stevensite, saponite, swinefordite, bidellite, nontronite, volkonskoite, and the like can be cited as the representatives of these compounds, but are not limited to them. Moreover, there can be used smectite silicate modified by phosphate or an organic material such as ammonia salt, or commercially available synthetic smectite such as IONITE, GALLEON EARTH, MIZUKANITE, BENCLAY, SILPHONITE, Aid-Plus (manufactured by Mizusawa Industrial Chemicals, Ltd.), LUCENTITE (manufactured by CO-OP Chemical Co., Ltd.), LAPONITE (Lapore Industry), and DP-DM or DM CLEAN (manufactured by Topy Industries, Limited).

Both the smectite silicate compound and the silazane compound are required to be compounded together at nanometer order, and the concentration of the smectite silicate is not specifically limited if only the compounding at nanometer order is attained. In consideration of the compounding thereof and the thixotropic property thereof as ink, an optimum concentration of the smectite silicate is in a range of 1 to 50% by weight. Although the addition amount thereof up to 99% by weight is possible if high barrier properties are attained, small concentration as far as possible is preferred.

The method of blending the smectite silicate compound in the silazane compound (matrix material) is not specifically limited. A method of modifying the interlayer of smectite-family laminar silicate compound by an organic material such as quaternary amine, and thus increasing the solubility in solvent, is adopted as a preferably used method (for example, refer to Japanese Patent Laid-Open No. H07-187656 (1995)). The silazane compound, which is the matrix material, is directly dissolved into the solution. Alternatively, dispersion is carried out by mixing the solution with another solution in which the matrix material is dissolved. Physical agitation or ultrasonic dispersion can be adopted as the dissolving method. If necessary, methods such as dissolving under heating is adopted.

According to the present invention, a solution containing the raw material silazane compound (matrix) and the smectite-family silicate compound is coated on a substrate by a solution process to form a film thereon. The solution process is not specifically limited.

Generally and preferably applied solution coating process includes coating process such as spin coating, dip coating, bar coating, spray coating, and blade coating. When coating is limited to a specific position, there can be applied: printing method such as screen printing, gravure printing, flexographic printing, relief printing, intaglio printing, and offset printing; ink-jet printing method; dispenser method; and drop-cast method. The solvent used in these methods is not specifically limited, and any kind is applicable, as long as the solvent does not damage the base layer. The kind of the solvent can be adequately selected depending on the kind of the base material.

Next, according to the present invention, the thin film thus obtained is irradiated with the ultraviolet radiation in an oxygen atmosphere to manufacture the silicon oxide thin film or the silicon oxynitride compound thin film containing the smectite-family silicate compound.

Under these reaction conditions, as described above, the coated film containing the silazane compound generates ammonia and oxygen under the photo-irradiation of the ultraviolet radiation in an oxygen atmosphere or in a nitrogen-containing oxygen atmosphere, and thus converts into the silicon oxide thin film or the silicon oxynitride thin film.

The oxygen atmosphere is formed by, for example, air, oxygen gas, and ozone. In addition, the coated film can be converted into the silicon oxynitride thin film by the irradiation of the ultraviolet radiation in a nitrogen atmosphere. Furthermore, the ratios of the constitutional elements of silicon, nitrogen, oxygen, and hydrogen in the film can be altered by varying the gas atmosphere during irradiation. For example, it is possible to form a thin film structured by silicon oxide inside thereof and by silicon oxynitride at the surface and near the surface thereof through ultraviolet irradiation in an oxygen atmosphere followed by changing the atmosphere to nitrogen.

Furthermore, the irradiation wavelength of ultraviolet light is not specifically limited. Generally used wavelength is in a range of 100 to 450 nm. The light of that wavelength can be attained by deuterium lamp, xenon lamp, metal halide lamp, exima lamp, mercury lamp, as well as an excimer laser or the like.

The thickness of thus obtained silicon oxide thin film or silicon oxynitride thin film containing smectite-family silicate compound is not specifically limited. The thickness thereof generally used is in a range of 10 nm to 100 μm, preferably in a range of 20 nm to 2 μm.

The following is the description about the silicon oxide thin film or the silicon oxynitride thin film containing smectite-family silicate compound obtained by the method of the present invention.

Figure 1:
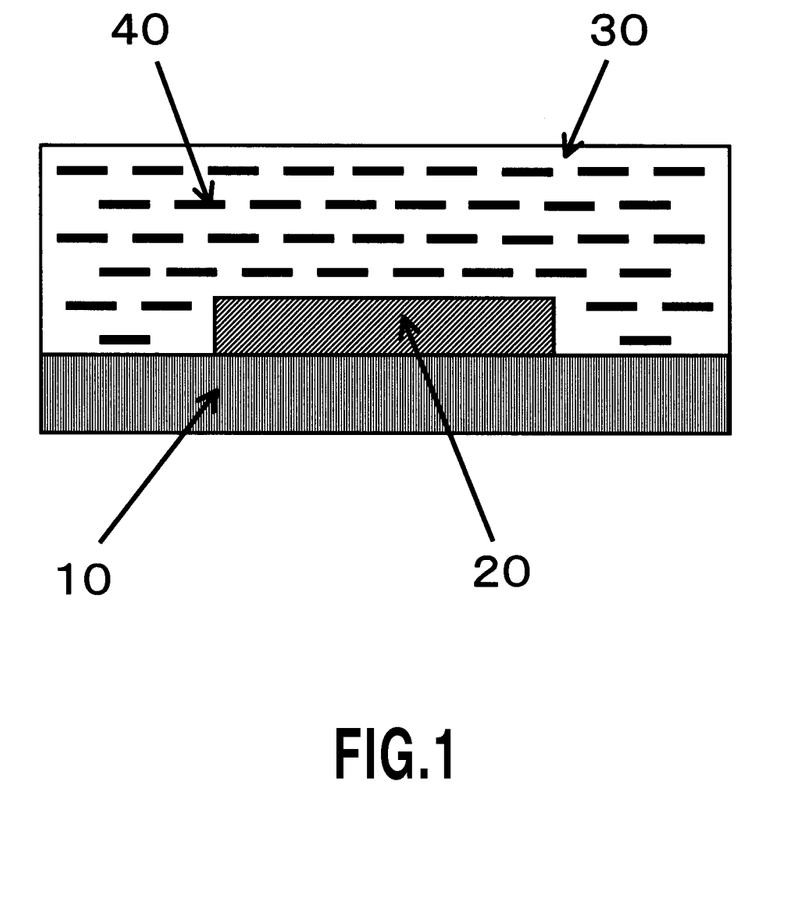
FIG. 1 illustrates a schematic cross sectional view of a representative thin film obtained by the method of the present invention.

A representative example of the thin film is a silicon oxide thin film or the silicon oxynitride thin film in which the flat-plate shaped smectite-family silicate molecule laminar compounds is arranged parallel to a surface of the film, as illustrated in FIG. 1. That type of arrangement structure is in an orientation state in which the barrier properties against water vapor and gas and the mechanical strength are most effectively exerted.

Furthermore, the thin film may be formed by a single layer of thin film or may be formed by multilayer thin film in which different thin films are laminated. When the multilayer thin film is formed, the thin film containing the smectite-family laminar silicate compound may be placed at any position of the laminating layers.

A more preferably used case is that the thin film containing the smectite-family laminar silicate compound is formed at outermost layer or near the outer layer. Moreover, among plurality of layers, more than one layers may be formed by thin films containing the smectite-family laminar silicate compound.

The thin film obtained by the present invention is suitably used as the protective film of organic EL device. The use of the thin film, however, is not limited to the above, and the thin film may be used on varieties of electronic devices such as transistor and solar cell. Specifically, the thin film is coated on semiconductor film, substrate, electrode, dielectric film, and the like. The composition of an organic semiconductor is not specifically limited, and the organic semiconductor may be constituted by a single substance or may be constituted of a mixture of plural substances. Furthermore, the organic semiconductor may be configured as a laminated structure of several kinds of substances. In addition, the organic semiconductor may be constituted by a laminar structure of several kinds of substances. Previously, the followings are known as organic semiconductor materials exhibiting excellent properties:

anthracene, tetracene, pentacene, or a derivative thereof substituted at an end thereof; α-sexi thiophene; perylene tetracarboxylic dianhydride (PTCDA) or derivatives thereof substituted at their terminal(s); naphthalene tetracarboxylic dianhydride (NTCDA) or derivatives thereof substituted at their terminal(s); copper phthalocyanine or derivatives thereof substituted at their terminal(s) with fluorine or the like; derivatives of copper phthalocyanine substituted at copper by nickel, titanium oxide, fluorinated aluminum, or the like, or derivatives thereof substituted at their terminal(s) with fluorine or the like; fullerene, rubrene, coronene, antradithiophene, or derivatives thereof substituted at their terminal(s); polyphenylene vinylene, polythiophene, polyfluorene, polyphenylene, polyacetylene, or derivative polymers thereof substituted at their terminal(s) or side chain(s).

The method of forming semiconductor layer is not specifically limited, and any method can be applied. Vapor-phase deposition method such as vacuum vapor deposition is often used. From the viewpoint of simple and low-cost method, however, there is applied printing method in which the layer is formed by mixing material with a solvent and coating its solution, such as spin coating, dip coating, bar coating, screen printing, gravure printing, flexographic printing, offset printing, and ink-jet printing. Furthermore, there can be applied a printing method such as the one called the soft-lithography including microcontact printing or micromolding.

Metals such as gold, silver, platinum, palladium, aluminum, copper, and magnesium; conductive compounds such as ITO and IZO; and alkali metals such as lithium and calcium can be used, but not limited thereto, as materials of electrodes. The method of producing the electrodes is not specifically limited, and any method can be applied. Generally applied methods is wiring by plating or the like. Also, wet production process in which a solution is coated or applied, such as gravure printing, screen printing, inkjet printing, can be adopted. In this case, silver paste, gold paste, carbon paste, as well as a conductive organic material such as thiophene-based conductive polymer (PEDOT), polyaniline, and a derivative thereof can be used. Furthermore, a dry manufacturing process different from the above can be applied, including vacuum vapor deposition method, sputtering method, and the like.

The materials forming the dielectric layer are not specifically limited, and any material can be used. Generally and preferably used materials are $SiO_2$ and the like. Further, in order to obtain more effective electric field effect, materials having a large dielectric constant, such as, for example, $Al_2O_3$, $ZrO_2$, $Ta_2O_5$, and $La_2O_3$, but not limited thereto, can be used. Moreover, in order to provide a device with flexibility, polymer dielectric materials such as polymethylmethacrylate, polyimide, polystyrene, polyparaxylene, polyfluorovinilydene, polyvinylphenol, and pullulan can be used.

EXAMPLES

The present invention will be described in more detail referring to the following examples. The present invention, however, is not limited to the examples.

Example 1

An n-type silicon wafer was subjected to ultrasonic cleaning for 15 minutes by using a neutral detergent (PURESOFT, manufactured by AS ONE Corporation) diluted with pure water to 5 fold, followed by ultrasonic cleaning in pure water for 15 minutes, to remove impurities. In addition, an UV-Ozone cleaner was applied to conduct ultraviolet radiation irradiation cleaning in an oxygen atmosphere for 20 minutes. The substrate thus cleaned was coated with a solution by spin-coating at 2000 rpm at 80° C. for drying 1 hour, the solution being prepared by mixing a dichloroethane solution of 5% by weight of LUCENTITE SPN (manufactured by CO-OP Chemical Co., Ltd.) and a specified amount of 20% by weight of polysilazane NP110 (manufactured by AZ Electronic Materials Limited) so that the weight ratio therebetween becomes 0:10, 2:8, 4:6, 6:4, 8:2, and 10:0, respectively, after film forming. Subsequently, the film was dried in a vacuum chamber at 100° C. for 30 minutes, followed by ultraviolet irradiation with an ultraviolet radiation having a wavelength of 172 nm for 10 minutes in a stream of 1:1 gas mixture of oxygen and nitrogen.

Figure 2:
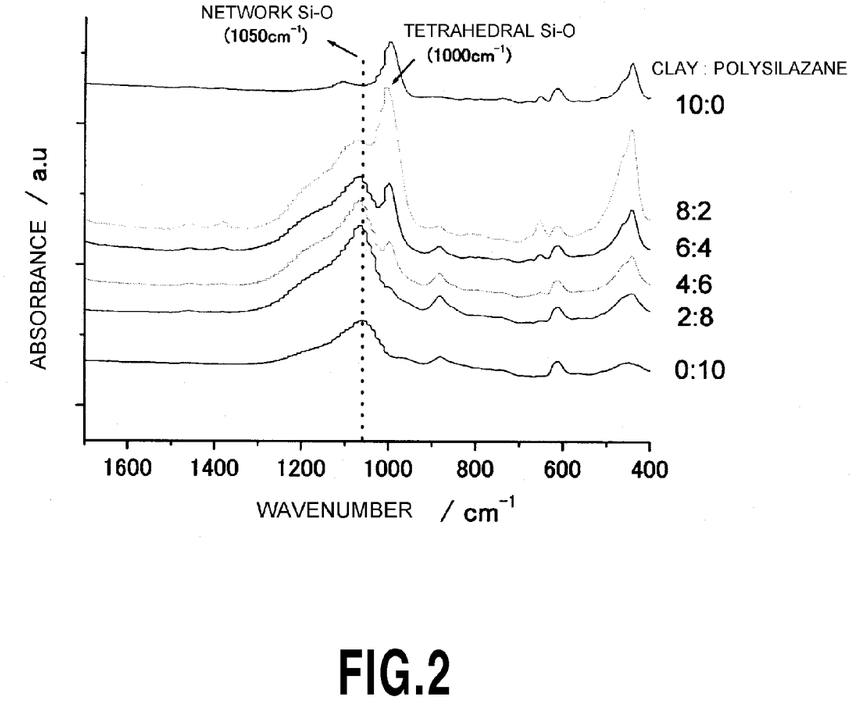
FIG. 2 shows infrared absorption spectra of silicon oxide thin films containing smectite-family silicate compounds, formed by Example 1 of the present invention.

FIG. 2 shows the infrared absorption spectra after irradiation of a light having a wavelength of 172 nm in a nitrogen atmosphere. On all the substrates, there was observed the absorption mainly at a wavelength of 1050 $cm^{-1}$ caused by the bond of silicon and oxygen, and thereby the conversion of polysilazane into a network-type $SiO_2$ was confirmed. In addition, for the sample with added LUCENTITE SPN (clay), there was observed absorption at a wavelength of 950 cm$^{-1}$ caused by the bond of silicon and oxygen in a regular tetrahedron structure of the clay, which shows that the clay was not decomposed by irradiation of the ultraviolet radiation but existed in the network-type SiO$_2$.

Figure 3:
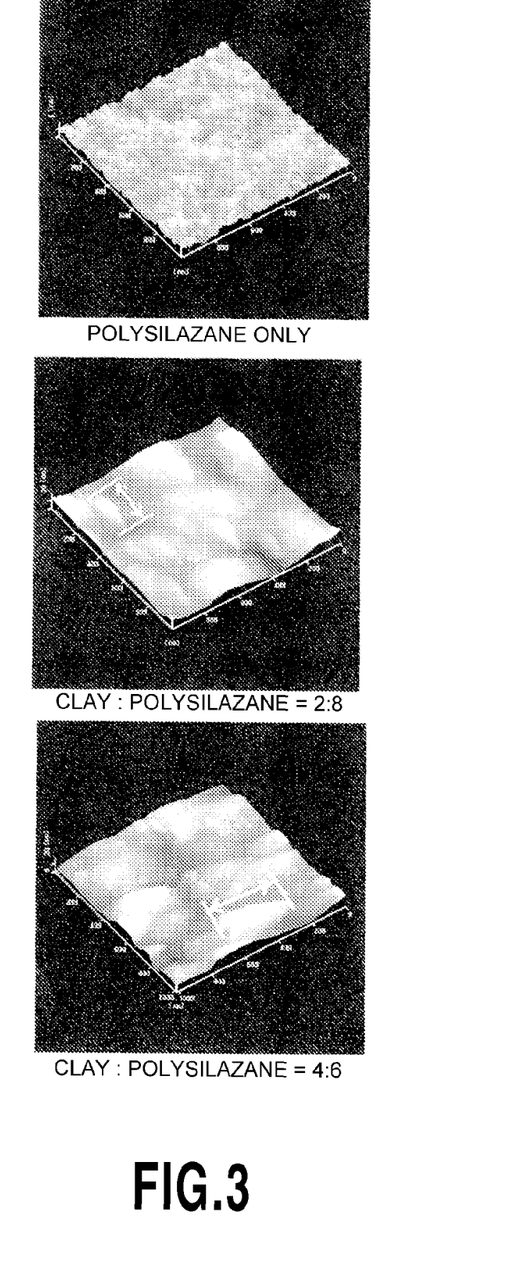
FIG. 3 shows surface AFM images (Part 1) of silicon oxide thin films containing smectite-family silicate compounds, formed by Example 1 of the present invention.
Figure 4:
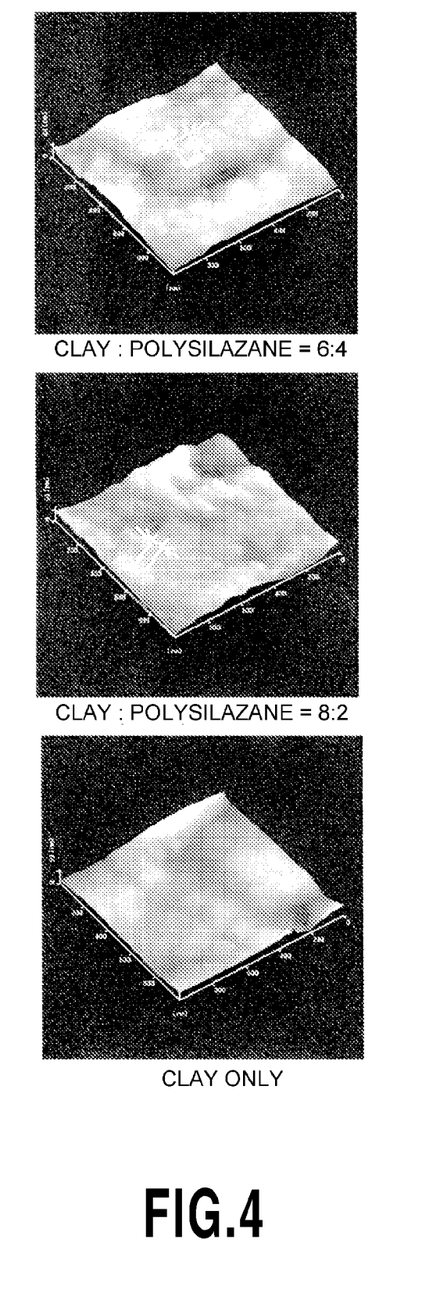
FIG. 4 shows surface AFM images (Part 2) of silicon oxide thin films containing smectite-family silicate compounds, formed by Example 1 of the present invention.

FIGS. 3 and 4 show the AFM images of the surface of films formed by the above method. In the cases of 6:4 and 8:2 of the weight ratio of the LUCENTITE SPN (clay) to polysilazane, there was observed a flat-shaped structure having a length of 100 nm corresponding to a monolayer of the smectite silicate compound. At these weight ratios, there was confirmed that the smectite silicate compound and the silicon oxide compound were not fully compounded, and that the smectite silicate compound was exposed on the surface of the film. In the cases of 2:8 and 4:6 having higher content of polysilazane, there was observed a structure having a length longer than that of the smectite silicate compound, which showed that the LUCENTITE SPN and the polysilazane were compounded together at nanometer level, and that they formed a structure several times larger than that of the smectite silicate compound. The compounding at that nanometer level provides a more dense film than a film in which smectite silicate compounds are simply arranged, and gave expectation of high barrier properties.

Figure 5:
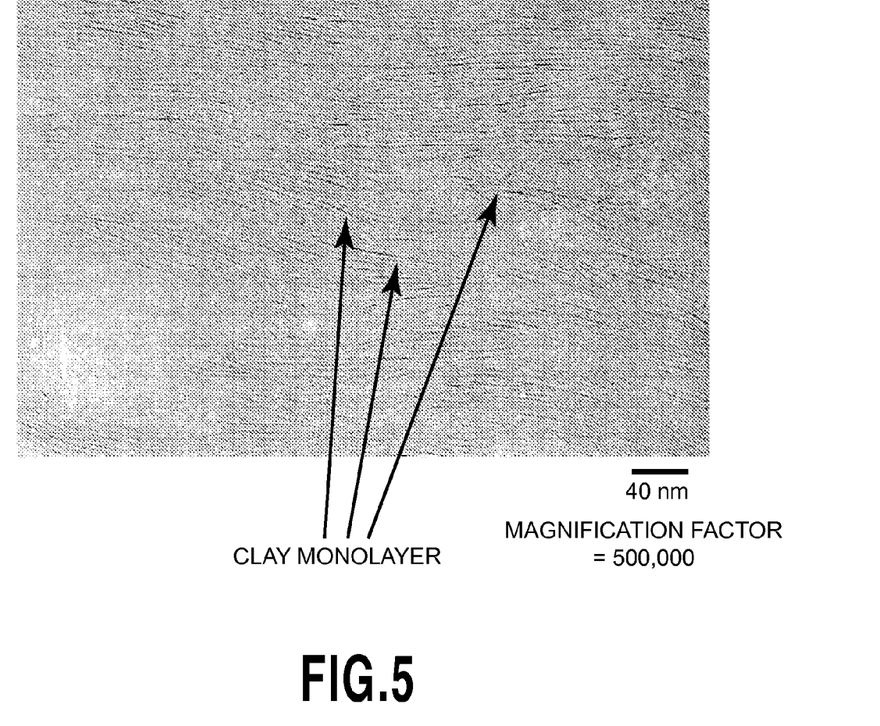
FIG. 5 shows a cross-sectional TEM image of a silicon oxide thin film containing a smectite-family silicate compound, formed by Example 1 of the present invention.

FIG. 5 shows a cross-sectional TEM image of thin film having a weight ratio of 5:5 of the LUCENTITE SPN to the polysilazane formed by the same method as that of the above after photo-irradiation. The vertical direction of the figure corresponds to the thickness direction of the cross section. The image shows the smectite silicate compound having about 1 nm in thickness and about 100 to 300 nm in length as black lines. The black lines corresponded to monolayers of smectite, and there was confirmed that the monolayers were arranged almost parallel to the surface of the substrate.

Example 2

On a PET substrate having a thickness of 50 μm, there was formed a film by using the blade coating method to coat a solution, followed by drying at 80° C. for 1 hour, the solution being prepared by mixing a dichloroethane solution of 5% by weight of LUCENTITE SPN (manufactured by CO-OP Chemical Co., Ltd.) and a specified amount of 20% by weight of polysilazane NP110 (manufactured by AZ Electronic Materials Limited) so that the weight ratio therebetween becomes 0:10, 2:8, 4:6, 6:4, 8:2, and 10:0, respectively, after film forming. After the coating, the film was dried in a vacuum chamber at 100° C. for 30 minutes, followed by irradiation with an ultraviolet radiation having a wavelength of 172 nm for 10 minutes in a stream of gas mixture of oxygen and nitrogen.

Figure 6:
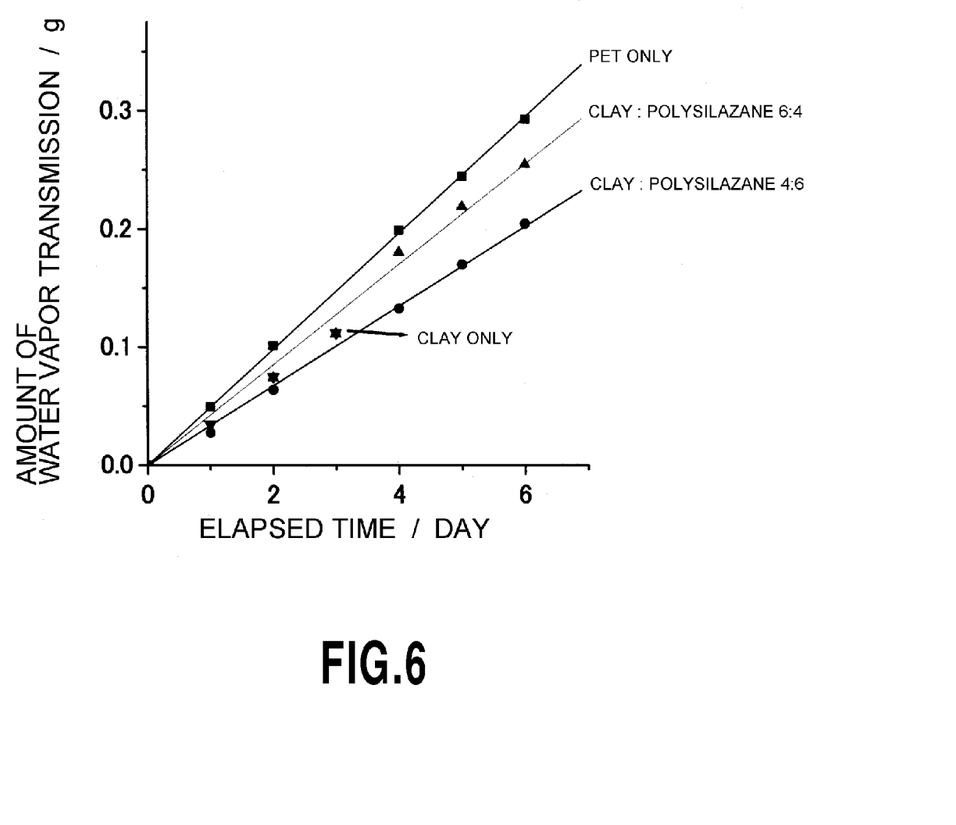
FIG. 6 illustrates variations of amount of water vapor permeation with time across silicon oxide thin films containing smectite-family silicate compounds, formed by Example 2 of the present invention.

For the films thus formed, the effect of the clay addition on the barrier properties against water vapor was evaluated by the cup method (JIS Z0208). The results are shown in FIG. 6. In order to perform evaluation within the range of measuring limit of the cup method, the respective films were formed in a shape of a thin film having a thickness of 400 nm or less. Compared with the bare PET substrate, the substrates coated with the respective films decreased the amount of permeated water vapor. In particular, it was confirmed that the PET substrate coated with LUCENTITE SPN and polysilazane in a weight ratio of 4:6 provided the highest barrier properties.

Example 3

When the protective film is coated only on a specified position, use of printing method such as screen printing, gravure printing, flexographic printing, relief printing, inta-glio printing, and offset printing; ink-jet printing; dispenser printing; drop-cast printing; or the like is conceived. The viscosity of the solution is required to be adjusted to the value suitable to the method. Generally the viscosity of the solution is required to be arbitrarily adjustable within a range of 0.05 to 100 Pa·s. An optimum viscosity is considered to be in a range of 10 to 100 Pas for the relief printing, 0.1 to 0.2 Pa·s for the flexographic printing, 0.05 to 0.2 Pa·s for the gravure printing, 100 Pa·s for the offset printing, and 1 to 10 Pa·s for the screen printing.

Table 1 shows the viscosity when the concentration ratio of dichloroethane solution of LUCENTITE SPN (manufactured by CO-OP Chemical Co., Ltd.) to polysilazane NP110 (manufactured by AZ Electronic Materials Limited) varies. It was confirmed that by the addition of smectite silicate compound at an arbitrary concentration, the viscosity of the solution can be adjusted to a viscosity allowing for almost all kinds of the printing methods. In the case where the concentration ratio of SPN to polysilazane is 4:6, the viscosity of the solution indicates a value exceeding 100 Pa·s, but the viscosity can be adjusted to a lower level by diluting the solution with a solvent.

TABLE 1

|  | Clay concentration (wt. %) | | | | |
| --- | --- | --- | --- | --- | --- |
|  | 0 | 20 | 40 | 80 | 100 |
| Viscosity (Pa · s) | 0.008 | 15 | 140 | 20 | 0.13 |

Figure 7:
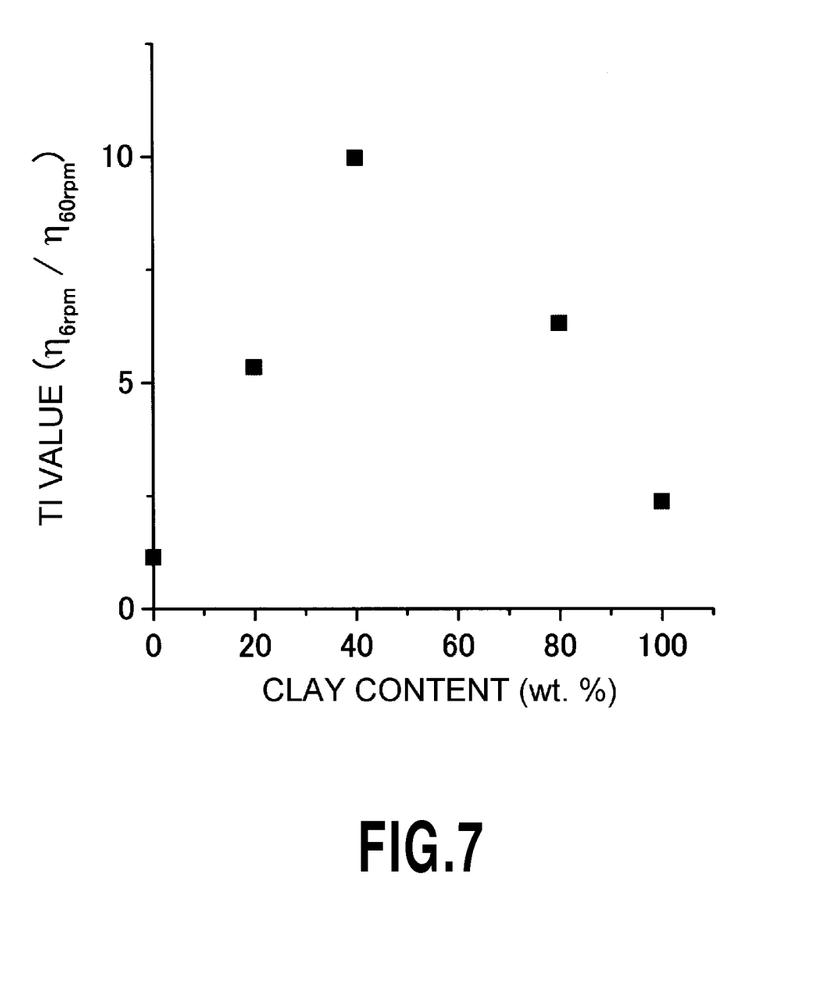
FIG. 7 illustrates the dependency of TI value of polysilazane solutions containing smectite-family silicate compounds prepared by Example 3 of the present invention on the concentration of the smectite-family silicate compound.

In order to apply to printing method, not only the control of viscosity but also the thixotropy control are important. Generally the viscosity at 6 rpm and 60 rpm is measured by a Brookfield viscometer, and the Thixotropic Index Value (TI Value) is calculated by the formula of (the viscosity at 6 rpm)/(the viscosity at 60 rpm). FIG. 7 shows the TI Values when the concentration ratio of a dichloroethane solution of LUCENT SPN (manufactured by CO-OP Chemical Co., Ltd.) to polysilazane NP110 (manufactured by AZ Electronic Materials Limited) varies. It was confirmed that by the addition of clay, the TI Value can be adjusted to 3 or more which is generally considered to have the thixotropic property.

INDUSTRIAL APPLICABILITY

The manufacturing method according to the present invention can efficiently manufacture a silicon oxide thin film or a silicon oxynitride thin film having high barrier properties against water vapor and oxygen and high strength by a solution process which has high advantage of productivity.

In accordance with this manufacturing method, the thin film can be formed on a plastic substrate having low thermal resistance and having plasticity, by a coating process. The thin film formed provides the substrate with high durability, which simplifies manufacturing process, saves energy, and enables film-state device, large area device, and flexible device. As a result, the manufacturing method is applicable to mass-production of electronic devices such as flexible display, electronic tag, electronic poster, and electronic paper, which highly require impact resistance, weather resistance, portability, low cost, and the like.

The invention claimed is:
1. A silicon oxide or silicon nitride oxide thin film comprising a smectite silicate laminar compound,
  wherein the smectite silicate laminar compound is present in an amount of 50% by weight of the thin film, wherein the smectite silicate laminar compound forms a laminar structure in which the smectite silicate laminar compound is oriented parallel to a surface of the thin film, and wherein the thin film has a thickness in a range of 10 nm to 100 μm.

2. The thin film according to claim 1, wherein the smectite silicate laminar compound has a formula of:

$$A_{1/3}B_mSi_4O_{10}(OH)_2 \cdot nH_2O$$

wherein
- A represents sodium, calcium, lithium or mixtures thereof,
- B represents one or two metals selected from the group consisting of aluminum, magnesium, lithium, iron, zinc, copper, nickel and chromium,
- Si represents silicon or a mixture of silicon and aluminum,
- OH represents hydroxide group,
- m represents 2 or 3, and
- n represents a positive rational number.

3. A method for forming a silicon oxide or silicon nitride oxide thin film comprising a smectite silicate laminar compound, wherein the smectite silicate laminar compound is present in an amount of 50% by weight of the thin film, wherein the smectite silicate laminar compound forms a laminar structure in which the smectite silicate laminar compound is oriented parallel to a surface of the thin film, and wherein the thin film has a thickness in a range of 10 nm to 100 μm, the method comprising the steps of:
- applying a solution of a silazane compound containing the smectite silicate laminer compound onto a surface of a substrate to form a coated film; and
- irradiating the coated film with a ultraviolet radiation in an oxygen atmosphere.

4. The method according to claim 3, wherein the smectite silicate laminar compound has a formula of:

$$A_{1/3}B_mSi_4O_{10}(OH)_2 \cdot nH_2O$$

wherein
- A represents sodium, calcium, lithium or mixtures thereof,
- B represents one or two metals selected from the group consisting of aluminum, magnesium, lithium, iron, zinc, copper, nickel and chromium,
- Si represents silicon or a mixture of silicon and aluminum,
- OH represents hydroxide group,
- m represents 2 or 3, and
- n represents a positive rational number.

* * * * *

UNITED STATES PATENT AND TRADEMARK OFFICE
CERTIFICATE OF CORRECTION

PATENT NO. : 8,673,070 B2
APPLICATION NO. : 13/061495
DATED : March 18, 2014
INVENTOR(S) : Uemura et al.

It is certified that error appears in the above-identified patent and that said Letters Patent is hereby corrected as shown below:

In the Specification

Column 1
Line 16, change "of solution process such as printing" to --of a solution process such as by a printing--
Line 20, change "need of using high vacuum" to --need for using a high vacuum--
Line 26, change "which is formed" to --which are formed--
Line 27, change "and has flexibility" to --and which have flexibility--
Line 34, change "layer" to --layers--
Line 36, change "to surrounding environment" to --to the surrounding environment--
Line 44, change "to be obtained" to --to obtain--
Line 48, change "for organic" to --for an organic--
Line 56, change "having increased" to --has increased--
Line 58, change "as a technology of increasing specifically the" to --as technology advances, specifically for the--
Line 62, change "absorbent" to --absorbs--

Column 2
Line 2, change "to be manufactured" to --to manufacture--
Line 7, change "the fields of food-products" to --in the fields of food products--
Line 15, change "to polymers" to --on polymers--
Line 60, change "atmosphere, that" to --atmosphere, and that--

Column 3
Line 18, change "represents hydroxyl group" to --represents a hydroxyl group--
Line 64, change "of amount" to --of the amount--

Column 5
Line 50, change "represents hydroxyl group" to --represents a hydroxyl group--

Signed and Sealed this
Eighth Day of July, 2014

Michelle K. Lee
*Deputy Director of the United States Patent and Trademark Office*

Column 6
Line 21, change "is adopted" to --are adopted--
Line 27, change "preferably applied" to --preferably an applied--
Line 28, change "includes coating" to --includes a coating--
Line 30, change "applied: printing" to --applied a printing--
Line 33, change "ink-jet printing method; dispenser" to --an ink-jet printing method; a dispenser--
Line 34, change "drop-cast method" to --a drop-cast method--

Column 7
Line 25, change "formed at" to --formed at the--
Line 27, change "plurality of layers, more than one layers" to --a plurality of layers, more than one layer--
Line 43, change "the followings are known" to --the following is known--
Line 61, change "forming semiconductor" to --forming a semiconductor--
Line 65, change "is applied" to --is an applied--

Column 8
Line 11, change "is wiring by plating or the like. Also, wet" to --are wiring by plating or the like. Also, a wet--
Line 13, change "inkjet" to --or inkjet--
Line 19, change "vacuum vapor" to --a vacuum vapor--
Line 24, change "obtain more" to --obtain a more--

Column 9
Line 20, change "provides a" to --provided a--
Line 55, change "limit" to --the limit--
Line 66, change "of printing" to --of a printing--

Column 10
Line 7, change "Pas" to --Pa's--